United States Patent [19]
Yang

[11] Patent Number: 6,166,835
[45] Date of Patent: Dec. 26, 2000

[54] HOLOGRAPHIC MEMORY

[75] Inventor: Keun-Young Yang, Kyonggi-do, Rep. of Korea

[73] Assignee: LG Electronics Inc., Seoul, Rep. of Korea

[21] Appl. No.: 09/320,536

[22] Filed: May 27, 1999

[30] Foreign Application Priority Data

May 28, 1998 [KR] Rep. of Korea ........................ 98/19554

[51] Int. Cl.[7] .............................. G03H 1/26; G03H 1/30; G03H 1/10; G02B 5/32; G11C 13/04
[52] U.S. Cl. ................... 359/22; 359/10; 359/25; 359/15; 359/1; 365/124; 365/125
[58] Field of Search .................... 359/3, 10, 11, 359/12, 30, 22, 15, 19, 25; 365/124, 125

[56] References Cited

U.S. PATENT DOCUMENTS 5,550,779 8/1996 Burr et al. ..................................... 359/3
5,946,115 8/1999 Noh ............................................ 359/22

Primary Examiner—Audrey Chang
Attorney, Agent, or Firm—Fleshner & Kim, LLP

[57] ABSTRACT

Holographic memory including a beam source for emitting a beam, a beam splitter for splitting the beam into a reference beam and an object beam, a hologram memory unit for recording information designated to a cell when the reference beam and the object beam are incident thereto at a time, and reproducing the information recorded before when only the reference beam is incident thereto, a first optical path changing unit for directing the reference beam to be incident to the hologram memory unit at an arbitrary angle for recording and reproduction of the information, including a first deflector for deflecting the reference beam to an arbitrary angle, a second deflector for re-deflecting the reference beam deflected at the first deflector in a vertical direction, and a telescope having at least one composite HOE (Holographic Optical Element) for directing the reference beam re-deflected at the second deflector to be incident to the hologram memory unit, and a second optical path changing unit for adjusting an optical path of the object beam to be incident to the hologram memory unit for recording the information, whereby increasing a recording capacity and improving productivity and cost.

8 Claims, 11 Drawing Sheets

FIG.5
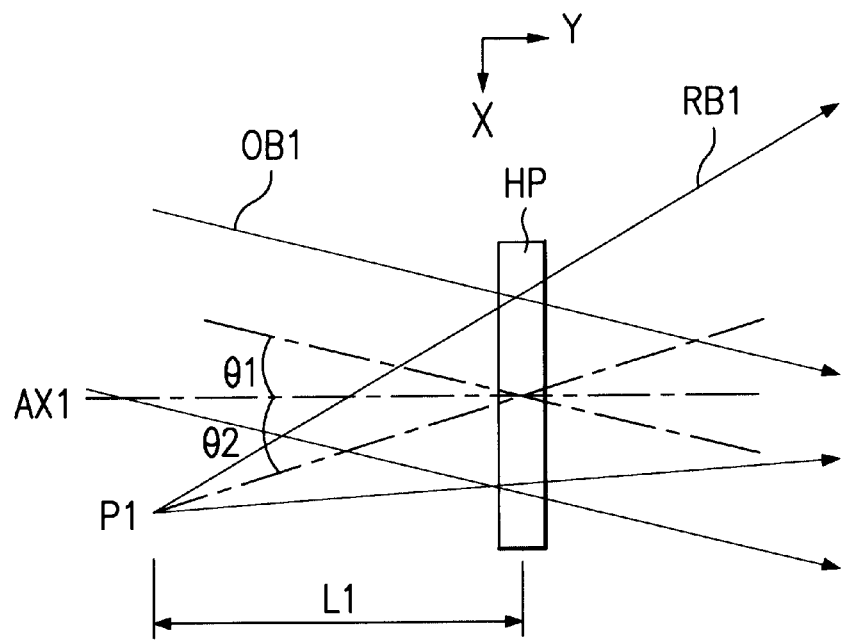
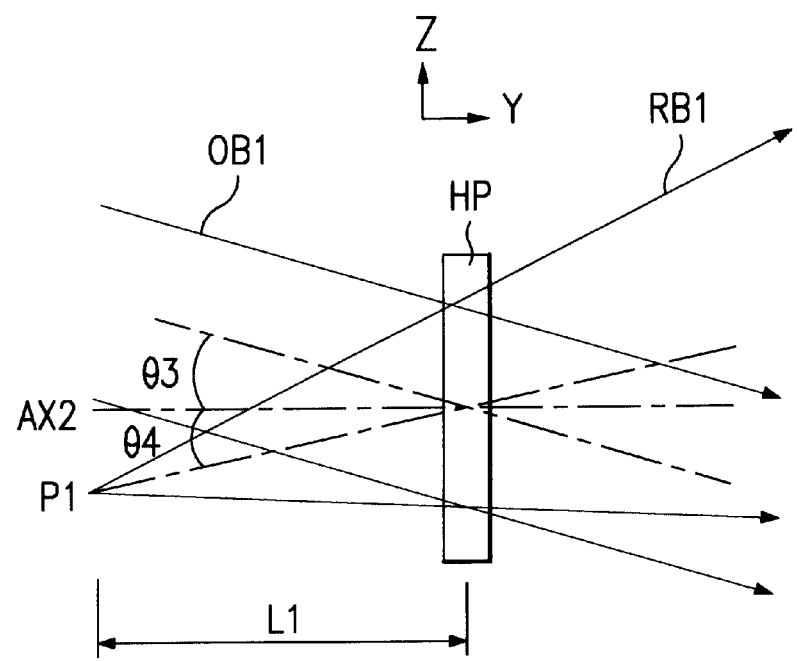

FIG.6
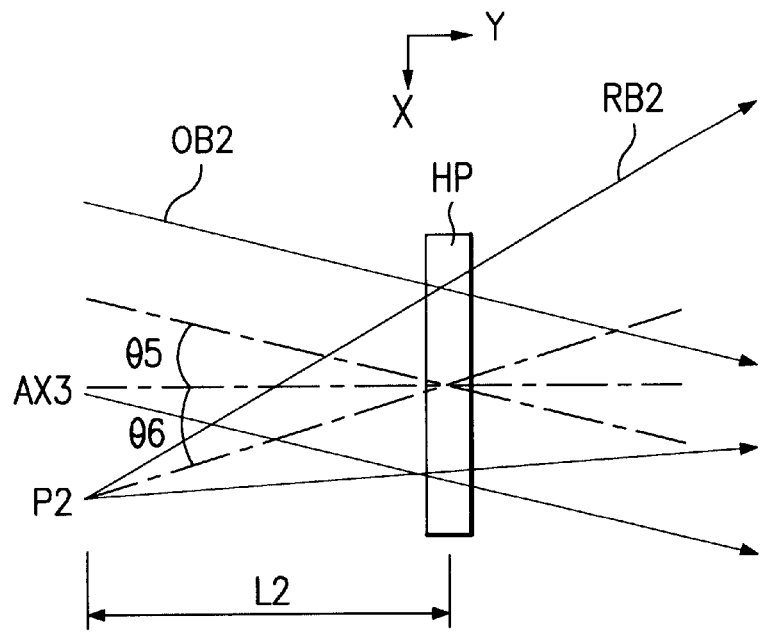
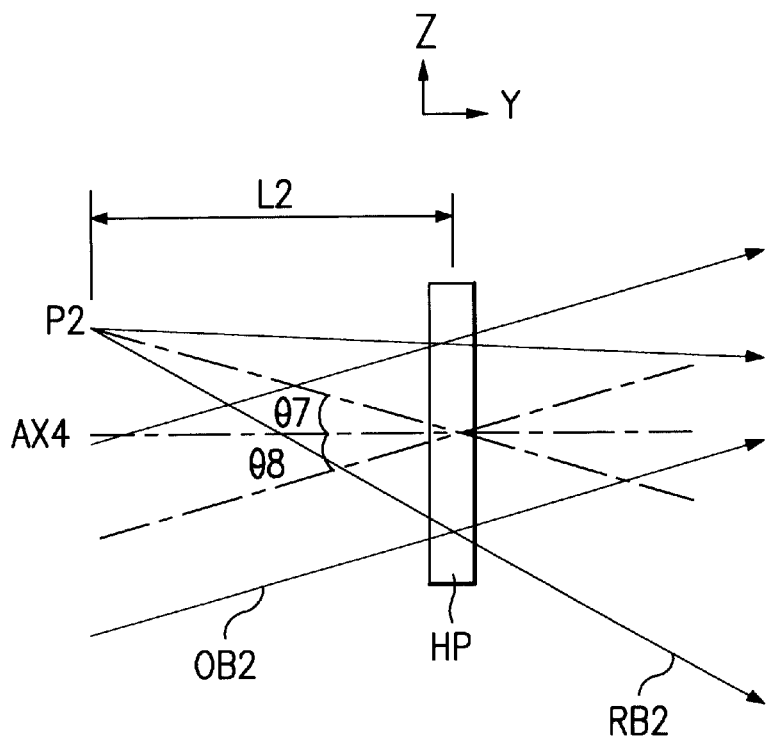

HOLOGRAPHIC MEMORY

BACKGROUND OF THE INVENTION

1. Field of the Invention

The present invention relates to a holographic memory.

2. Background of the Related Art

As large scale recording and reproduction of information is required, recently optical information recording/reproduction technologies which can make three dimensional information recording/reproduction using holography is under development other than two dimensional recording/reproduction devices using optical disk recording medium, such as CD and DVD and the like.

Referring to FIG. 1, the information recording/reproduction device using holography is provided with a laser 15 for a light source, and a beam splitter 14 for splitting a beam 16 from the laser 15 into a reference beam 6 and an object beam 7. The reference beam part is provided with in an order of a beam expander 12 for expanding a diameter of the reference beam 6, a beam deflector 11 for directing the reference beam 6 expanded by the beam expander 12 toward a telescope 9 with an 1:1 magnifying power and changing an incident angle to the telescope 9, and the telescope 9 for forming an image of a reflecting plane of the beam deflector 11 on a recording medium 103, and the object beam part is provided with in an order of a beam interrupter 17 for controlling advance of the beam, a beam expander 13 for expanding a diameter of the object beam 7, a reflector 10 for deflecting a direction of beam, an SLM(Spatial Light Modulator) 1 for displaying information, an FTL(Fourier Transform Lens) 102 for subjecting an image displayed on the SLM 1 to Fourier transform onto the recording medium 103. The recording medium 103 is positioned at a place the reference beam 6 and the object beam 7 are met, an image forming lens 4 is provided at a place a given distance away from the recording medium 103 in the direction of the object beam 7, a CCD(Charge Coupled Device) 5 is provided at an image forming plane of the image forming lens 4 for converting an image from the SLM 1 into an electrical signal, and the SLM 1 and the CCD 5 are put under the control of a computer 8.

The operation of the aforementioned holographic memory will be explained.

Upon displaying information on the SLM 8 by the computer 8 and the reference beam 6 and the object beam 7 are to the recording medium 103 on the same time, the object beam 7 and the reference beam 6 make an interference, to form an interference pattern, which is recorded on the recording medium 103. After the recording, if the object beam 7 is interrupted by the beam interrupter 17 while the reference beam 6 is directed to the recording medium 103, the reference beam 6 is diffracted by the interference pattern recorded on the recording medium 103, to reproduce the object beam 7 advancing in the direction of the CCD 5. If the object beam 7 is formed an image on the CCD 5 through the image forming lens 4, the image displayed on the SLM 1 is formed on the CCD 5, and the computer 8 stores and analysis the electrical signal from the CCD 5. Another information may be recorded by displaying the another information on the SLM 1 and changing an angle of deflection of the beam deflector 11, wherein, even if the angle of deflection is changed by the beam deflector 11, an incident angle of the reference beam 6 to the recording medium 103 is changed while the image formation of the image formation plane on the recording medium 103 is maintained the same, because the telescope 9 positioned between the beam deflector 11 and the recording medium 103 has a magnifying power of 1:1. Eventually, the reference beams 6 having slightly different incident angles and the object beam 7 form slightly different interference patterns respectively at the same position of the recording medium 3, which are recorded on the recording medium 103. Therefore, upon directing the reference beam 6 to the interference patterns overlapped at the same position, only the interference pattern formed by the reference beam 6 having the same incident angle with the reference beam 6 used in recording and the object beam 7 satisfies the Bragg condition, thereby reproducing only one object beam 7. That is, by controlling an incident angle of the reference beam 6, the object beam 7 can be reproduced, selectively.

There have been a variety of studies for increasing a recording capacity of the memory using the aforementioned holography, a related art of which is illustrated in FIG. 2. The device illustrated in FIG. 2 is the related art device shown in FIG. 1 added with beam deflectors 18 and 19 for deflecting beam in a direction perpendicular to the direction of beam deflection of the beam deflector 11, i.e., at a xz-plane. As shown in FIG. 3, in the device, the recording medium 103 is divided in z-axis direction for recording information, thereby increasing a recording capacity.

However, because the technology also utilizes the recording medium 103 only one dimensionally, the technology has a limitation in increasing the recording capacity.

SUMMARY OF THE INVENTION

Accordingly, the present invention is directed to a holographic memory that substantially obviates one or more of the problems due to limitations and disadvantages of the related art.

An object of the present invention is to provide a holographic memory which can increase a recording capacity by using an HOE(Holographic Optical Element).

Another object of the present invention is to provide a holographic memory at a low cost.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the holographic memory includes a hologram memory unit for recording information using a reference beam and an object beam, a first optical path changing unit for directing the reference beam to be incident to the hologram memory unit at an arbitrary angle for recording and reproduction of the information, including a first deflector for deflecting the reference beam to an arbitrary angle, a second deflector for re-deflecting the reference beam deflected at the first deflector in a vertical direction, and a telescope having at least one composite HOE(Holographic Optical Element) for directing the reference beam redeflected at the second deflector to be incident to the hologram memory unit, and a second optical path changing unit for adjusting an optical path of the object beam to be incident to the hologram memory unit for recording the information.

In other aspect of the present invention, there is provided the holographic memory including a beam source for emitting a beam, a beam splitter for splitting the beam into a reference beam and an object beam, a hologram memory unit for recording information designated to a cell when the reference beam and the object beam are incident thereto at a time, and reproducing the information recorded before when only the reference beam is incident thereto, a first optical path changing unit for directing the reference beam to be incident to the hologram memory unit at an arbitrary angle for recording and reproduction of the information, including a first deflector for deflecting the reference beam to an arbitrary angle, a second deflector for re-deflecting the reference beam deflected at the first deflector in a vertical direction, and a telescope having at least one composite HOE(Holographic Optical Element) for directing the reference beam re-deflected at the second deflector to be incident to the hologram memory unit, and a second optical path changing unit for adjusting an optical path of the object beam to be incident to the hologram memory unit for recording the information.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIG. 5 illustrates a relation between an object beam and a reference beam of a first HOE in FIG. 4;

FIG. 6 illustrates a relation between an object beam and a reference beam of a second HOE in FIG. 4;

DETAILED DESCRIPTION OF THE PREFERRED EMBODIMENT

Figure 1:
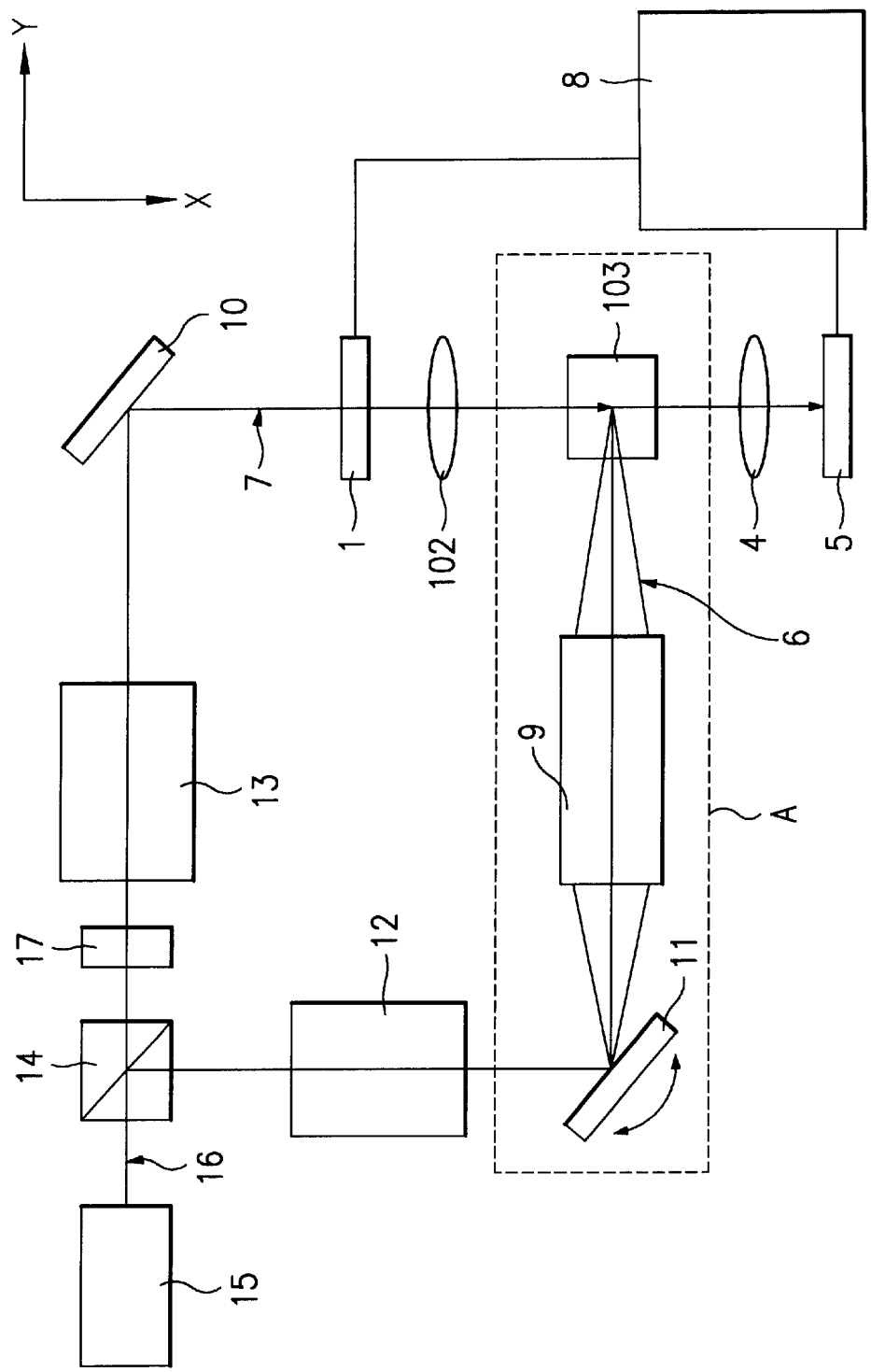
FIGS. 1 and 2 illustrate systems of related art holographic memories, respectively.
Figure 2:
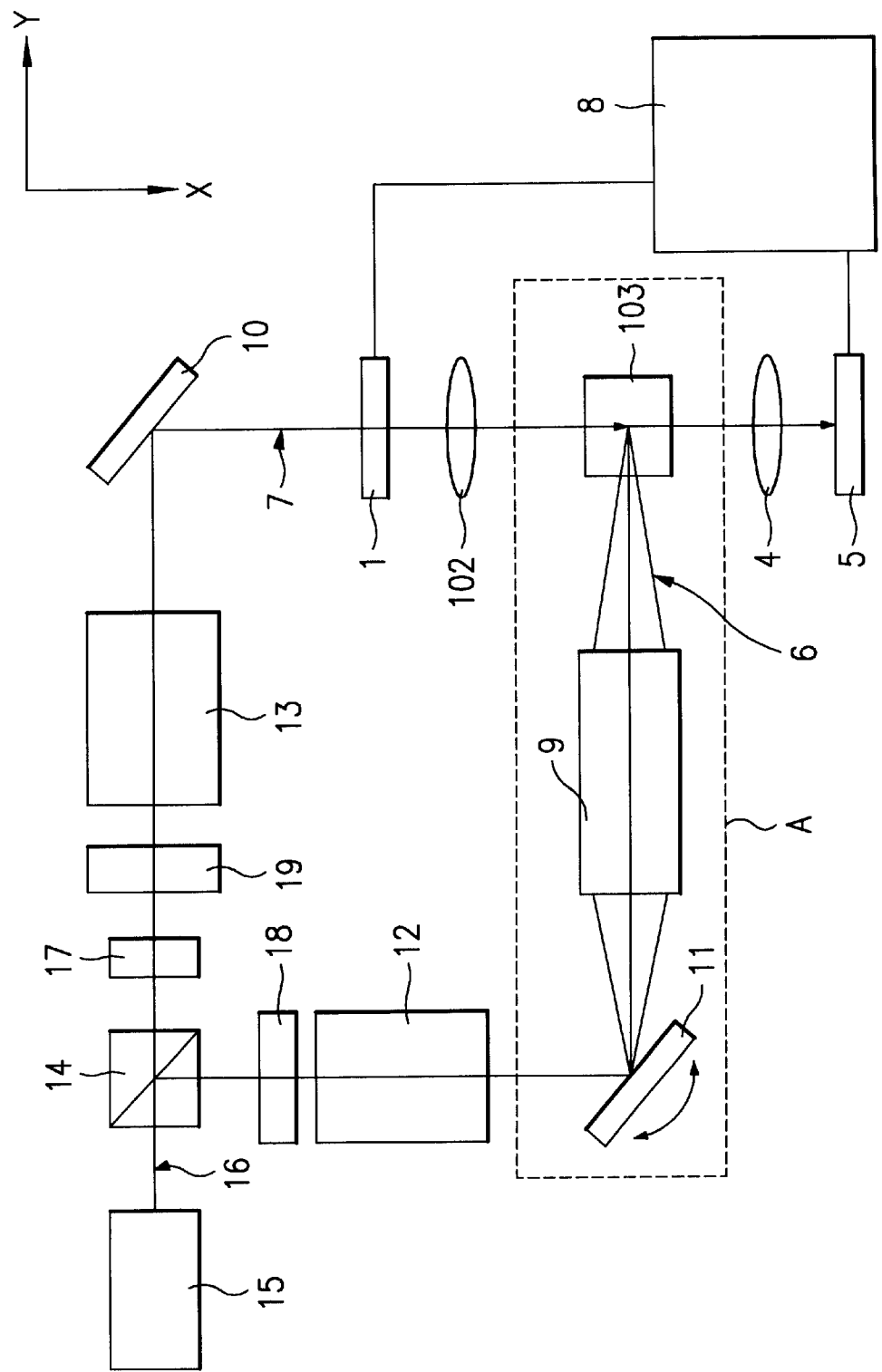
Figure 3:
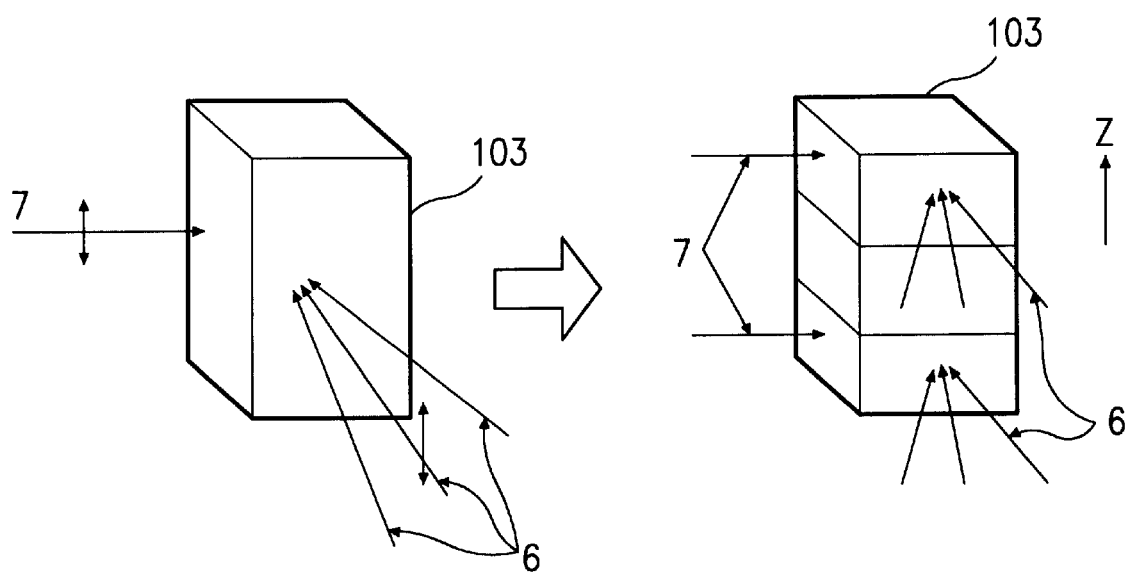
FIG. 3 illustrates recording methods of the systems illustrated in FIGS. 1 and 2.
Figure 4:
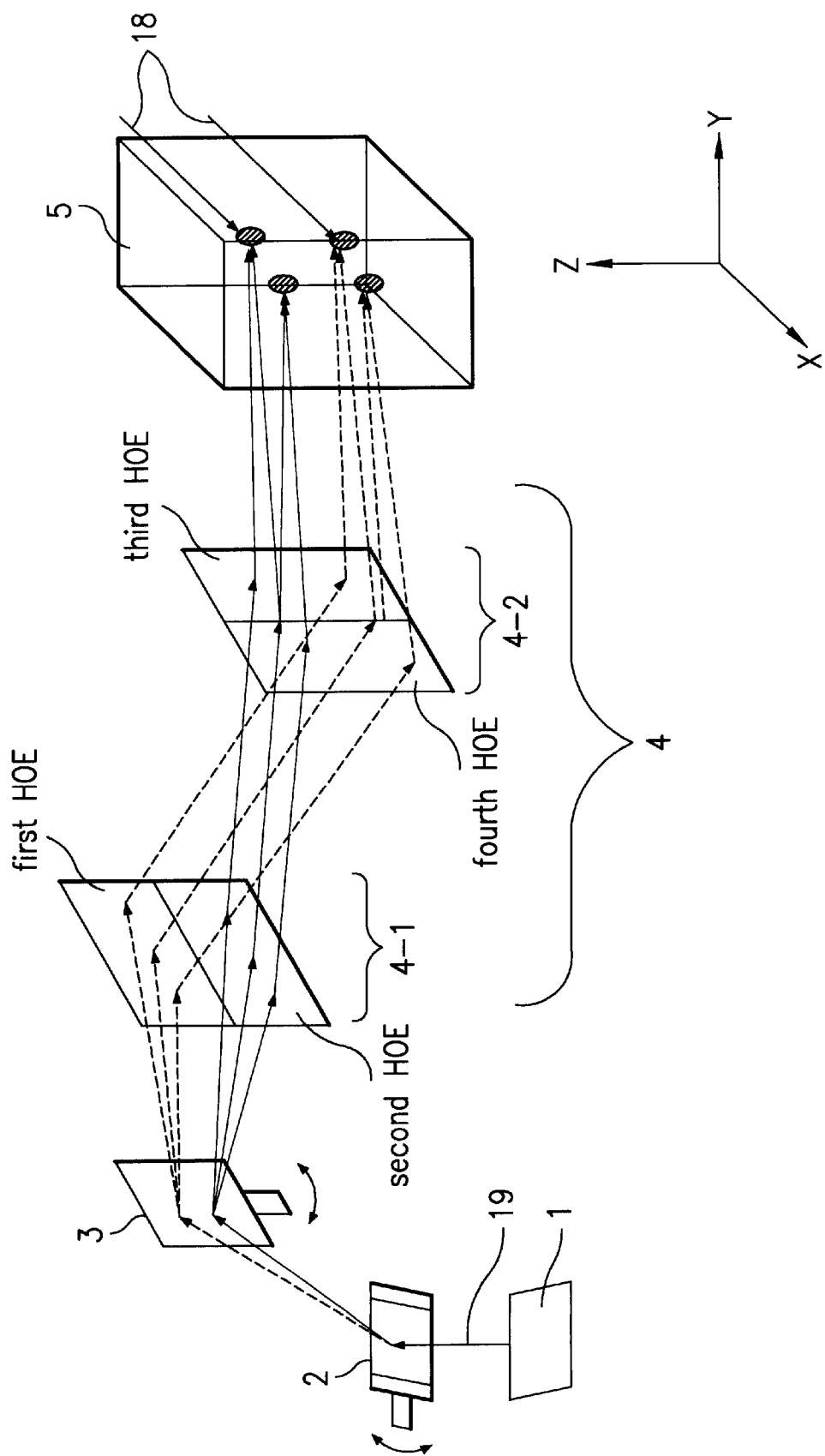
FIG. 4 illustrates a telescopic system of a holographic memory in accordance with a first preferred embodiment of the present invention.
Figure 7:
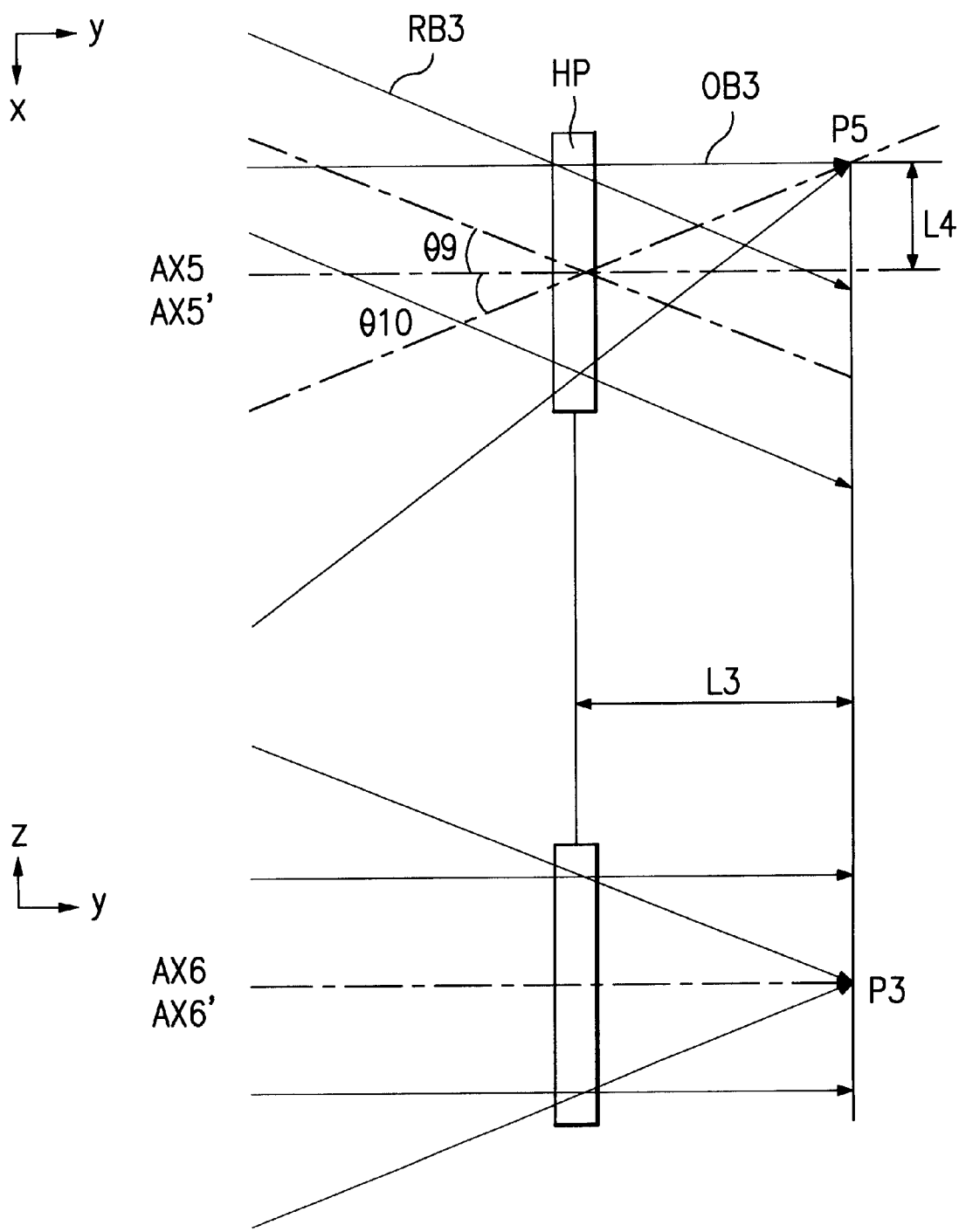
FIG. 7 illustrates a relation between an object beam and a reference beam of third and fourth HOEs in FIG. 4, respectively.
Figure 10:
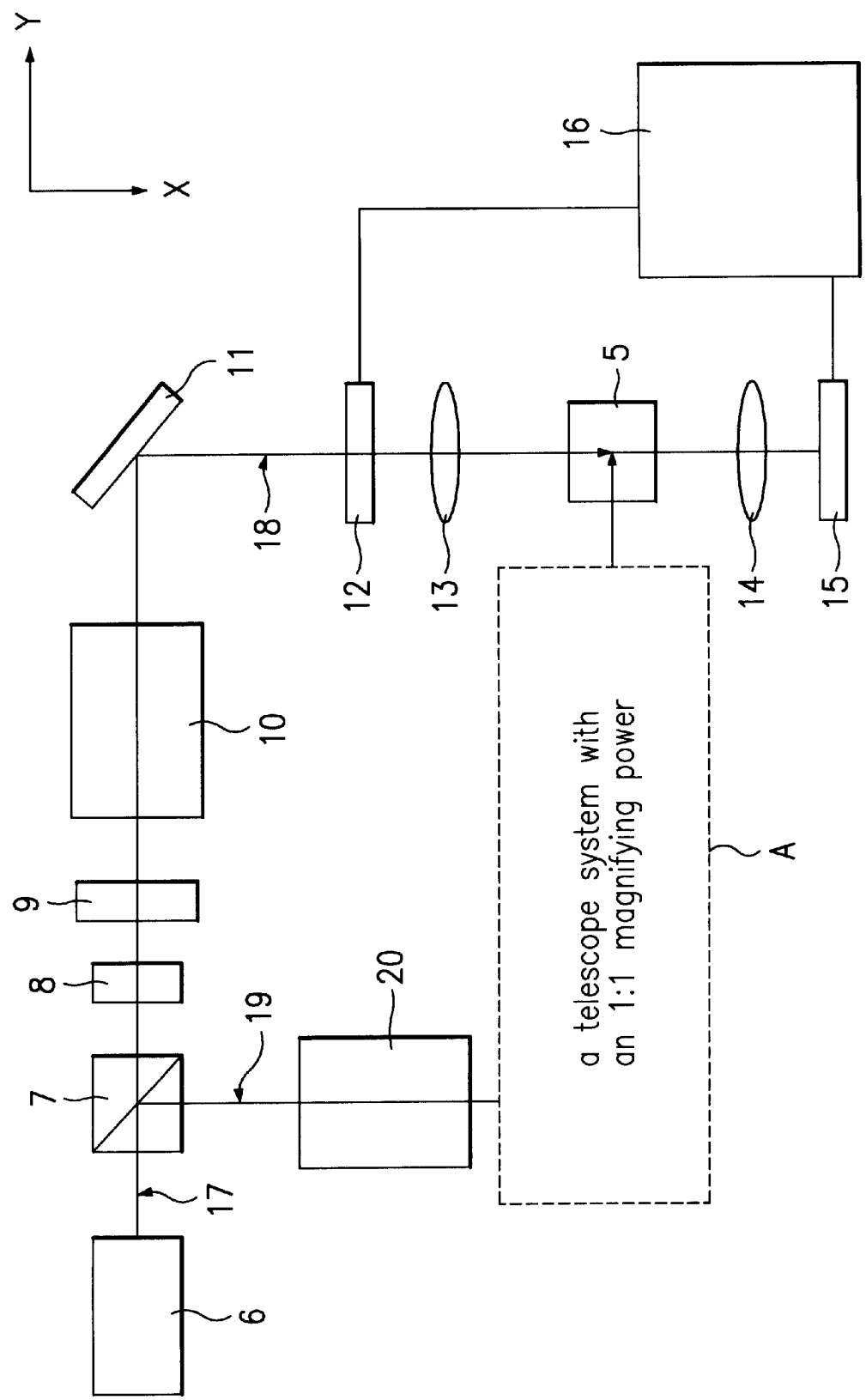
FIG. 10 illustrates a holographic memory in accordance with a preferred embodiment of the present invention; and, FIG. 11 illustrates a telescopic system of a holographic memory in accordance with a second preferred embodiment of the present invention.
Figure 11:
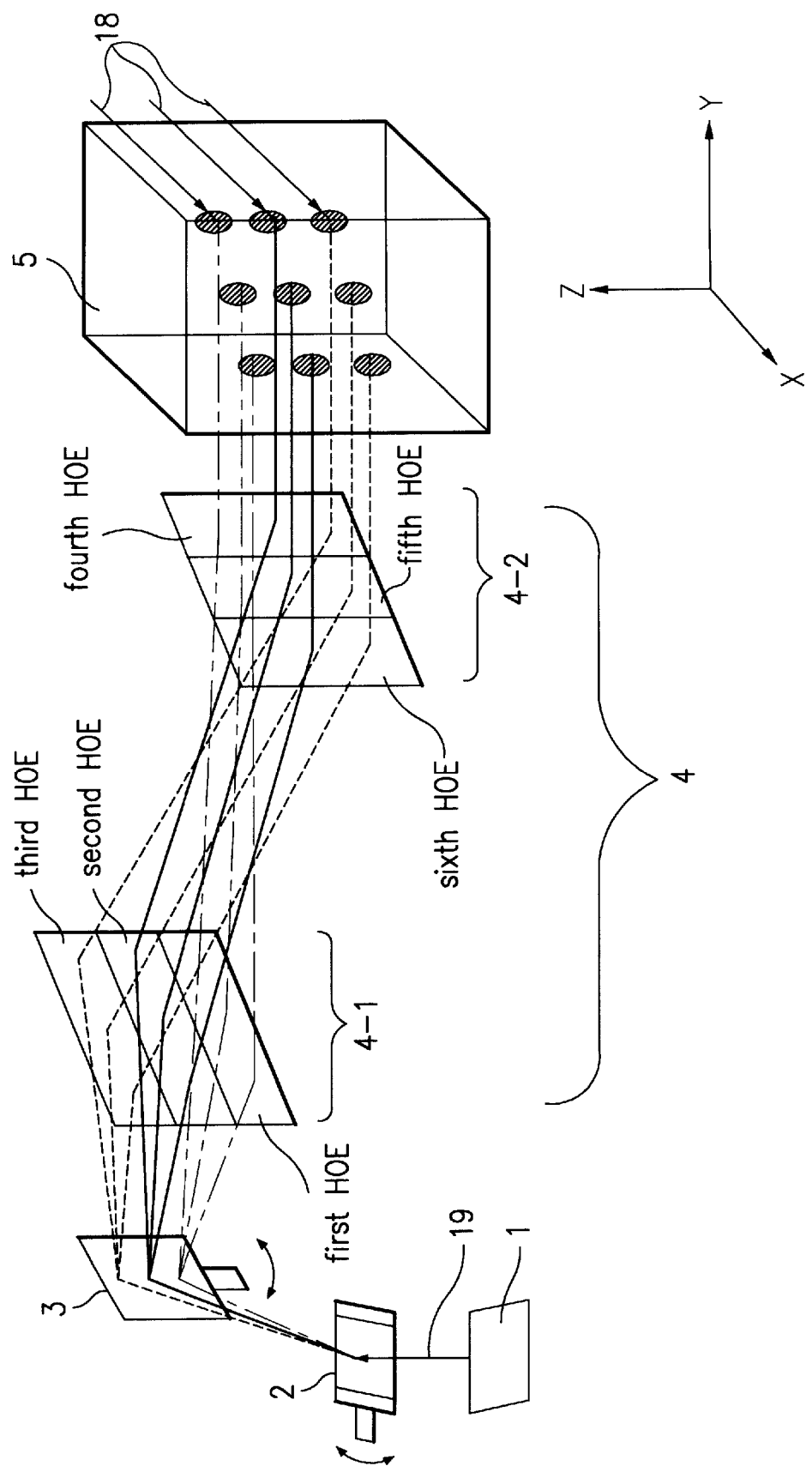

Reference will now be made in detail to the preferred embodiments of the present invention, examples of which are illustrated in the accompanying drawings. FIG. 10 illustrates a holographic memory in accordance with a preferred embodiment of the present invention, which has a system the same with the related art shown in FIG. 2 on the whole, excluding 'A' part in FIGS. 1 and 2, which of the present invention includes, as shown in FIG. 4, a reflector 1 for directing the beam toward a first beam deflector 2, a second beam deflector 3 for re-deflecting the beam deflected at the first beam deflector 2 perpendicular(xy-plane) to a direction of deflection of the first beam deflector 2, a telescope 4 with an 1:1 magnifying power for forming images of reflecting surfaces of the first and second beam deflectors 2 and 3 on a recording medium 6. The telescope 4 with an 1:1 magnifying power is composed of more than one HOE (Holographic Optical Element) 4-1 and 4-2, to compose a composite HOE, each of which HOE has an object beam-reference beam relation as shown in FIGS. 5, 6 and 7. The first HOE has a reference beam RB1 which is a diverging beam starting to diverge from a point P1 a distance L1 away from a hologram plate HP and having an angle $\theta 2$ to an optical axis AX1 on an xy-plane and an angle $\theta 4$ to an optical axis AX2 on a yz-plane, of the hologram plate HP, and an object beam OB1 which is a plane beam having an angle $\theta 1$ to the optical axis AX1 on the xy-plane and an angle $\theta 3$ to the optical axis AX2 on the yz-plane, of the hologram plate HP. And, the second HOE has a reference beam RB2 which is a diverging beam starting to diverge from a point P2 a distance L2 away from a hologram plate HP and having an angle $\theta 6$ to an optical axis AX3 on an xy-plane and an angle $\theta 7$ to an optical axis AX4 on a yz-plane, of the hologram plate HP, and an object beam OB2 which is a plane beam having an angle $\theta 5$ to the optical axis AX3 on the xy-plane and an angle $\theta 8$ to the optical axis AX4 on the yz-plane, of the hologram plate HP. And, third and fourth HOE have a reference beam RB3 which is a plane beam having an angle $\theta 9$ to optical axes AX5, 5' on an xy-plane and parallel to optical axes AX6, 6' on a yz-plane, of the hologram plate HP, and an object beam OB3 which is a converging beam starting to converge from a point P3 a distance L3 away from the hologram plate and having an angle $\theta 10$ to the optical axes AX5, 5 on the xy-plane and parallel to the optical axes AX6, 6' on the yz-plane, of the hologram plate HP.

Parameters which characterize the object beams and the reference beams of the first, second, third and fourth HOEs have the following relations.

$$\theta 1 = \theta 5 = \theta 9 \tag{1}$$

$$\theta 2 = \theta 6 \tag{2}$$

$$L1 = L2 = L3 \tag{3}$$

Figure 8:
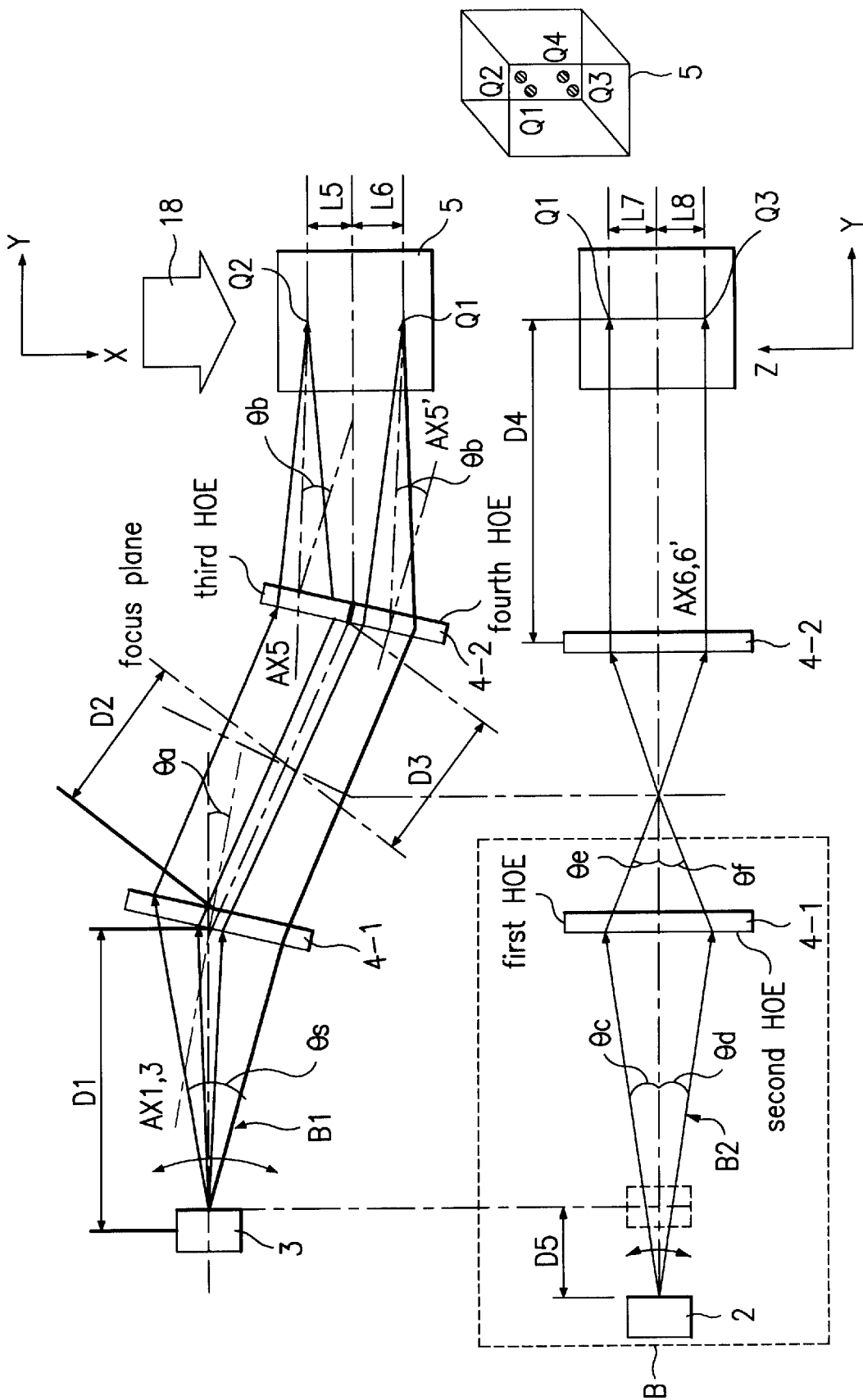
FIG. 8 illustrates the operation of the optical system in FIG. 4.
Figure 9:
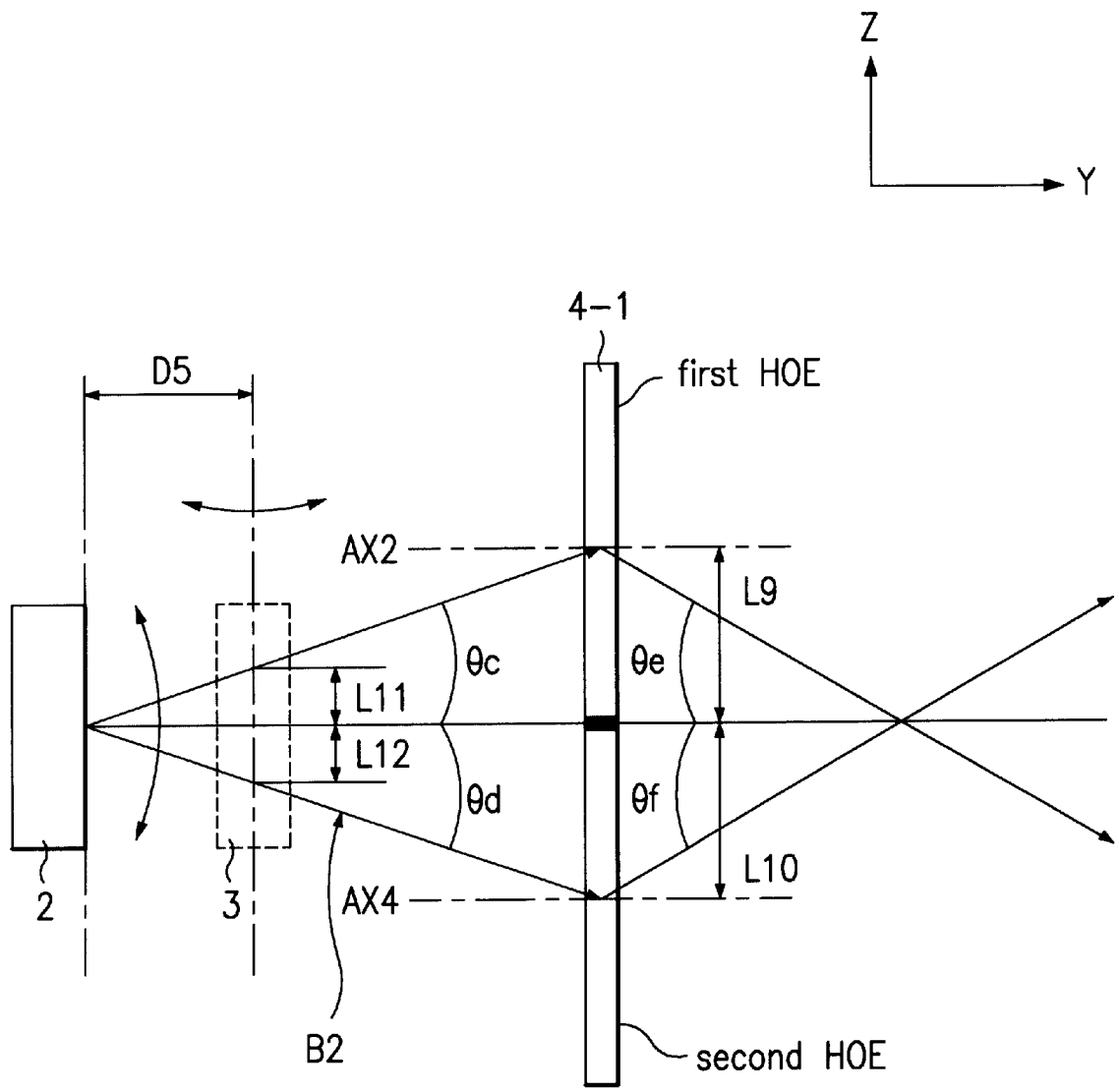
FIG. 9 illustrates a detail of "B" part in FIG. 8.

In the meantime, as shown in FIGS. 4 and 8, the telescope system with an 1:1 magnifying power of the composite HOE 4-1 and 4-2 has a first beam deflector 2, a second beam deflector 3 at a position a distance D5 away from the first beam deflector 2, a first composite HOE 4-1 a distance D1 away from the second beam deflector 3, a second composite HOE 4-2 a distance D2+D3 away from the first composite HOE 4-1, and a recording medium 5 a distance D4 away from the second composite HOE 4-2. The first composite HOE 4-1 is disposed parallel to the second composite HOE 4-2, such that the optical axes AX1, 3 on the xy-plane of the first composite HOE 4-1 have an angle $\theta a$ to y axis, and an optical axis AX2 of a first HOE in the first composite HOE 4-1 is a distance L9 away from y-axis in a +z direction and an optical axis AX4 of a second HOE in the first composite HOE 4-1 is a distance L10 away from y-axis in a −z direction. And, an optical axis AX5 of a third HOE in the second composite HOE 4-2 is a distance L5/cos($\theta b$) away from y-axis in a −x direction, and an optical axis AX5' of a fourth HOE in the second composite HOE 4-2 is a distance L6/cos($\theta b$) away from y-axis in a +x direction.

Parameters of the telescope system with an 1:1 magnifying power have the following relations.

$$\theta a = \theta 2 = \theta 6 \quad (4)$$

$$\theta b = \theta 10,\ \theta c = \theta 4,\ \theta d = \theta 7,\ \theta e = \theta 3,\ \text{and}\ \theta f = \theta 8 \quad (5)$$

$$D1 = D2 = D3 = D4 = L1/\cos(\theta 2) = L2/\cos(\theta 6) = L3/\cos(\theta 9) \quad (6)$$

$$L5 = L6 = L4/\cos(\theta 10) \quad (7)$$

$$L11 = D5 \times \tan(\theta c),\ L12 = D5 \times \tan(\theta d) \quad (8)$$

$$L9 = L11 + L1 \times \tan(\theta 4),\ L10 = L12 + L2 \times \tan(\theta 7) \quad (9)$$

Where, the parameters have absolute values, D5 denotes a distance between the first beam deflector and the second beam deflector, D1 denotes a distance between the second beam deflector and the first composite HOE, D2+D3 denotes a distance between the first composite HOE and the second composite HOE, D4 denotes a distance between the second composite HOE and the hologram memory, θa denotes an angle of an optical axis on an xy-plane of the first composite HOE to y-axis, θb denotes an angle of an optical axis on an xy-plane of the second composite HOE to y-axis θc and θd denote angles between an optical axis on a yz-plane of the first composite HOE and a beam incident to the first composite HOE, θe and θf denote angles between an optical axis on a yz-plane of the first composite HOE and a beam diffracted from the first composite HOE and incident to the second composite HOE, L4 denotes a distance between an optical axis on a xy-plane of a third HOE and a position at which an object beam of the third HOE is focused, L5 and L6 denote a distance between an optical axis on a xy-plane of a hologram memory and a position at which a beam diffracted from the second composite HOE is incident to the hologram memory, L9 denotes a distance between an optical axis on a yz-plane of the first composite HOE and an optical axis of the first HOE, L10 denotes a distance between an optical axis on a yz-plane of the first composite HOE and an optical axis of the second HOE, and L11 and L12 denote a distance between an optical axis on a yz-plane of a first composite HOE and a position at which a z-axis of the second beam deflector meets with a beam incident to a first composite HOE.

The operation of the aforementioned holographic memory of the present invention will be explained. Though the basic operation principle of the holographic memory of the present invention is identical to the operation principle of the related art holographic memory, operation of the telescope system of an 1:1 magnifying power composed of HOEs which allow two dimensional addressing for overcoming the capacity limit of the related art is different. A method for recording using the telescope system(A) of the present invention will be explained, with reference to FIGS. 4~10.

A laser beam 17 from a laser 6 is split into a reference beam 19 and an object beam 18 by the beam splitter 7, of which object beam 18 is incident to the recording medium 5 via the third beam deflector 9, the second beam expander 10, the second reflector 11, the SLM 12 and the FTL 13 in succession, and reference beam 19 is incident to the recording medium 5 via the first beam expander 20 and the telescope A with an 1;1 magnifying power. In this instance, if the object beam 18 is controlled to be spaced by L8 from y axis in a −z direction by the third beam deflector 9 which deflects the object beam 18 on an xz-plane and if the reference beam 19 provided to the telescope system is controlled to be incident to the first composite HOE 4-1 at an angle of θc(=θ4) to the optical axis AX2 of the first composite HOE 4-1 by the first beam deflector 2 which deflects the reference beam 19 on an xz-plane, the incident beam is diffracted by θe at the first HOE to be incident to the second composite HOE 4-2 at θe, and diffracted toward Q3 or Q4 point on the recording medium 5 by the second composite HOE 4-2. The diffraction of the reference beam either toward Q3 or Q4 is dependent on controlling of the second beam deflector 3 which deflects the reference beam on an xy-plane. That is, if a deflection angle of the second beam deflector 3 is controlled such that the reference beam is incident to the fourth HOE in the second composite HOE 4-2, the reference beam 19 diffracted by the first HOE is diffracted toward Q3 a distance L6 away from y-axis in a +x direction by the fourth HOE, crosses with the object beam 18 at Q3 on the recording medium 5, to make interference between the two beams to form an interference pattern, which is recorded on the recording medium 5. As shown in FIG. 8, if the second beam deflector 3 is controlled such that the reference beam B1 is incident to the first HOE at an angle θs on an xy-plane, because the reference beam diffracted by the first HOE is incident to the third HOE from the fourth HOE, and because the reference beam incident to the third HOE is diffracted toward Q4 by the third HOE, an interference pattern is recorded at the Q4 position from a moment the reference beam is incident to the third HOE. Then, if the object beam 18 is controlled to be spaced by L7 from y axis in a +z direction by the third beam deflector 9 which deflects the object beam 18 on an xz-plane and if the reference beam 19 provided to the telescope system is controlled to be incident to the first composite HOE 4-1 at an angle of θd(=θ7) to the optical axis AX2 of the first composite HOE 4-1 by the first beam deflector 2 which deflects the reference beam 19 on an xz-plane, the incident beam is diffracted by θf at the first HOE to be incident to the second composite HOE 4-2 at θf and diffracted toward Q1 or Q2 point on the recording medium 5 by the second composite HOE 4-2. As has been explained, the diffraction of the reference beam either toward Q1 or Q2 is dependent on controlling of the second beam deflector 3 which deflects the reference 1 beam on an xy-plane. That is, if a deflection angle of the second beam deflector 3 is controlled such that the reference beam is incident to the fourth HOE in the second composite HOE 4-2, the reference beam 19 diffracted by the first HOE is diffracted toward Q1 a distance L6 away from y-axis in a +x direction by the fourth HOE, crosses with the object beam 18 at Q1 on the recording medium 5, to make interference between the two beams to form an interference pattern, which is recorded on the recording medium 5. As shown in FIG. 8, if the second beam deflector 3 is controlled such that the reference beam B1 is incident to the second HOE at an angle θs on an xy-plane, because the reference beam diffracted by the second HOE is incident to the third HOE from the fourth HOE, and because the reference beam incident to the third HOE is diffracted toward Q2 by the third HOE, an interference pattern is recorded at the Q2 position from a moment the reference beam is incident to the third HOE. Thus, by controlling the first and second beam deflectors 2 and 3 which deflect the reference beam as well as the third beam deflector 9 which deflects the object beam, information can be recorded on Q1, Q2, Q3, Q4 of the recording medium with an increased capacity more than the related art.

Though the present invention has been explained with reference to composite HOEs each having two HOEs different from each other, if composite HOEs each having more than two HOEs different from each other may be used for further increased recording capacity.

That is, if each of the first and second composite HOEs 4-1 and 4-2 is provided with three HOEs different from one another, recordable positions on the recording medium are nine, and, if each of the first and second composite HOEs 4-1 and 4-2 is provided with four HOEs different from one another, recordable positions on the recording medium are 16, which is a significant increase of the recording capacity.

The holographic memory of the present invention has the following advantages.

First, the two dimensional addressing of the reference beam made available by the present invention allows to overcome the problem of the related art which has a limit in increasing the recording capacity.

Second, the present invention is favorable significantly in view of productivity and cost because HOEs are used, which is favorable for mass production, instead of the precision lens required in the telescope with an 1:1 magnifying power used in the related art.

It will be apparent to those skilled in the art that various modifications and variations can be made in the holographic memory of the present invention without departing from the spirit or scope of the invention. Thus, it is intended that the present invention cover the modifications and variations of this invention provided they come within the scope of the appended claims and their equivalents.

What is claimed is:

1. A holographic memory comprising:

a hologram memory unit for recording information using a reference beam and an object beam;

a first optical path changing unit for directing the reference beam to be incident to the hologram memory unit at an arbitrary angle for recording and reproduction of the information, including;

a first deflector for deflecting the reference beam to an arbitrary angle, a second deflector for re-deflecting the reference beam deflected at the first deflector in a vertical direction, and a telescope having a first composite HOE(Holographic Optical Element) and a second composite HOE, each of the first and second composite HOEs comprising plural HOEs, wherein HOEs are arranged either horizontally or vertically in the first composite HOE and HOEs are arranged either horizontally or vertically in the second composite HOE such that the HOEs of the first composite HOE are perpendicular to HOEs of the second composite HOE for directing the reference beam re-deflected at the second deflector to be incident to the hologram memory unit; and, a second optical path changing unit for adjusting an optical path of the object beam to be incident to the hologram memory unit for recording the information.

2. A holographic memory as claimed in claim 1, wherein the telescope has an 1:1 magnifying power.

3. A holographic memory comprising:

a beam source for emitting a beam;

a beam splitter for splitting the beam into a reference beam and an object beam;

a hologram memory unit for recording information designated to a cell when the reference beam and the object beam are incident thereto at a time, and reproducing the information recorded before when only the reference beam is incident thereto;

a first optical path changing unit for directing the reference beam to be incident to the hologram memory unit at an arbitrary angle for recording and reproduction of the information, including;

a first deflector for deflecting the reference beam to an arbitrary angle, a second deflector for re-deflecting the reference beam deflected at the first deflector in a vertical direction, and a telescope having a first composite HOE (Holographic Optical Element) and a second composite HOE, each of the first and second composite HOEs comprising plural HOEs, wherein HOEs are arranged either horizontally or vertically in the first composite HOE and HOEs are arranged either horizontally or vertically in the second composite HOE such that the HOEs of the first composite HOE are perpendicular to HOEs of the second composite HOE for directing the reference beam re-deflected at the second deflector to be incident to the hologram memory unit; and, a second optical path changing unit for adjusting an optical path of the object beam to be incident to the hologram memory unit for recording the information.

4. A holographic memory as claimed in claim 3, wherein the first optical path changing unit further includes;

a beam expander positioned after the beam splitter for expanding a beam diameter of the reference beam split at the beam splitter, a reflector positioned after the beam expander for changing a direction of advance of the reference beam expanded by the beam expander.

5. A holographic memory as claimed in claim 3, wherein a recording capacity of the hologram memory unit is determined as a multiplication of a number of HOEs in the first composite HOE and a number of HOEs in the second composite HOE.

6. A holographic memory as claimed in claim 3, wherein the second optical path changing unit further includes;

an optical interrupter for passing an incident object beam in recording and blocking the object beam in reproduction, a third beam deflector for deflecting the object beam passed through the optical interrupter toward an arbitrary direction, a beam expander for expanding a beam diameter of the object beam deflected at the third beam deflector, a reflector for changing a direction of advance of the object beam expanded by the beam expander, a light modulator for modulating the object beam incident from the reflector, a lens for subjecting the object beam displayed on the light modulator to Fourier transformation and providing to the hologram memory unit, and an optical detector for converting optical information reproduced from the hologram memory unit into an electrical signal in a reproduction.

7. A holographic memory as claimed in claim 6, wherein the third beam deflector has a deflection direction identical to the deflection direction of the first beam deflector in the first optical path changing unit.

8. A holographic memory as claimed in claim 3, wherein the telescope has an 1:1 magnifying power.

* * * * *